United States Patent
Cheng et al.

(10) Patent No.: US 7,074,701 B2
(45) Date of Patent: Jul. 11, 2006

(54) METHOD OF FORMING A BORDERLESS CONTACT OPENING FEATURING A COMPOSITE TRI-LAYER ETCH STOP MATERIAL

(75) Inventors: Yi-Lung Cheng, Danshuei, Taipei (TW); Shih-Chia Cheng, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 109 days.

(21) Appl. No.: 10/718,881

(22) Filed: Nov. 21, 2003

(65) Prior Publication Data
US 2005/0112859 A1 May 26, 2005

(51) Int. Cl.
*H01L 21/31* (2006.01)
(52) U.S. Cl. ............ 438/597; 438/769; 438/786; 438/637
(58) Field of Classification Search ............ 438/597, 438/618, 622, 629, 634, 637–640, 769, 786
See application file for complete search history.

(56) References Cited

U.S. PATENT DOCUMENTS

| | | | | |
|---|---|---|---|---|
| 5,596,230 | A | 1/1997 | Hong | 257/758 |
| 5,731,242 | A | 3/1998 | Parat et al. | 438/586 |
| 5,972,722 | A | 10/1999 | Visokay et al. | 438/3 |
| 6,080,674 | A | 6/2000 | Wu et al. | 438/692 |
| 6,174,810 | B1 * | 1/2001 | Islam et al. | 438/687 |
| 6,617,232 | B1 * | 9/2003 | Kim et al. | 438/597 |
| 6,849,562 | B1 * | 2/2005 | Lang et al. | 438/778 |

OTHER PUBLICATIONS

Wolf et al. "silicon processing for the VLSI Era" 1986, vol. 1, pp. 182-195, 551-555, 581-582.*

* cited by examiner

*Primary Examiner*—Thanh Nguyen (57) ABSTRACT

A method of forming an opening in a stack of insulator layers featuring an underlying etch stop layer comprised of a tri-layer insulator composite, has been developed. The tri-layer insulator composite comprised of a bottom silicon rich, silicon oxide layer and a top silicon nitride layer, is first formed on a conductive region of a semiconductor substrate. After deposition of overlying insulator layers a photoresist shape is used as a etch mask to allow the desired contact or via hole shape to be defined in the overlying insulator layers via a first phase of an anisotropic dry etch procedure, with the first phase of the dry etching procedure terminating at the top surface of the silicon nitride layer. An over etch procedure used to insure complete removal of overlying insulator layer from the surface of the tri-layer insulator composite, is next performed as a second phase of the anisotropic dry etch procedure. The high etch rate ratio of insulator layer to silicon nitride allows the over etch cycle to be successfully accomplished without risk to underlying materials. A third phase of the anisotropic dry etch procedure selectively removes the silicon nitride layer and subsequently selectively removes the silicon rich, silicon oxide layer without damage to the now exposed conductive region, resulting in definition of the desired contact or via hole openings in the stack of insulator layers.

27 Claims, 4 Drawing Sheets

METHOD OF FORMING A BORDERLESS CONTACT OPENING FEATURING A COMPOSITE TRI-LAYER ETCH STOP MATERIAL

BACKGROUND OF THE INVENTION (1). Field of the Invention

The present invention relates to methods used to fabricate semiconductor devices, and more specifically to a method used to define a contact or via opening in a group of dielectric layers to expose an underlying conductive or isolation region of a semiconductor device.

(2) Description of Prior Art

Micro-miniaturization, or the ability to fabricate semiconductor devices with sub-micron features, has allowed improved device performance to be realized while still reducing the fabrication cost for the same semiconductor chips, comprised with the higher performing devices. Smaller features allow performance degrading parasitic capacitances to be reduced, while a greater number of smaller, higher performing semiconductor chips obtained from a specific size starting semiconductor substrate, result in a reduced fabrication cost for each specific semiconductor chip. The reduced area allotted to each semiconductor chip can however present difficulties not encountered for less dense semiconductor chips. For example contact or via openings formed in a group of dielectric layers, used to expose an underlying conductive region and to subsequently accommodate a conductive via structure, can no longer afford the benefit of being fully landed on the underlying conductive region. The ability to form a non-fully landed contact or via opening, referred to as a borderless opening, is dependent on the ability of the etching procedure to completely remove dielectric material from all openings independent of the thickness uniformity of the dielectric layer across the entire semiconductor substrate. An over etch cycle used for the contact opening procedure, employed to insure complete removal of dielectric material independent of thickness uniformity, has to feature excellent selectivity to the exposed underlying materials so that the etch procedure terminates or significantly slows at end point. Unwanted removal of exposed conductive or insulator material during the over etch cycle can result in reduced device performance or yield loss.

This invention will describe a procedure for defining a contact or via opening in a stack of dielectric layers featuring a novel tri-layer composite located as the underlying material of the stack of dielectric layers. The etch rate selectivities of the components of the tri-layer composite allow a dielectric over etch cycle to be employed without risk of penetrating or removing the conductive or insulator regions needed to be exposed in the contact or via openings. Prior art such as Visokay et al, in U.S. Pat. No. 5,972,722, Hong, in U.S. Pat. No. 5,596,230, Parat et al, in U.S. Pat No. 5,731,242, and Wu et al, in U.S. Pat. No. 6,080,674, describe methods of forming self-aligned contact and via openings using underlying etch stop layers. None of these prior art however describe the unique tri-layer composite employed in the present invention, allowing the contact opening procedure to employ an over etch cycle without the risk of attacking or removing exposed underlying regions of the semiconductor device.

SUMMARY OF THE INVENTION

It is an object of this invention to define a contact or via opening in a stack of insulator layers to expose an underlying conductive region of a semiconductor device.

It is another object of this invention to employ a tri-layer insulator composite, located as an underlying component of the stack of insulator layers, to be used as a stop layer for the contact or via opening definition.

It is another object of this invention to employ a contact or via opening definition procedure featuring high etch rate selectivity between the overlying insulator layers and the underlying tri-layer insulator composite stop layer, to allow an extended insulator over etch cycle to be used to insure against thickness uniformity of the overlying insulator layer component of the stack of insulator layers.

In accordance with the present invention a method of defining a contact or via opening in a stack of insulator layers featuring an underlying tri-layer insulator composite, used as a stop layer during the dry etch contact opening definition procedure, is described. A tri-layer insulator composite comprised of an underlying silicon rich oxide layer, a hydra-silicon oxynitride (SiOxNH) layer, and an overlying silicon nitride layer, is formed on the surface of a conductive or insulator region of an underlying semiconductor device. A boro-phosphosilicate glass (BPSG) layer and an overlying silicon oxide layer are next deposited on the tri-layer composite. After application of a bottom anti-reflective coating (BARC) layer, a photoresist shape is defined, and used as an etch mask to allow an anisotropic reactive ion etch (RIE) procedure to define the desired contact or via opening in the silicon oxide and BPSG layers, with the dry etch procedure terminating in the silicon nitride component of the tri-layer composite. A critical over etch cycle is then employed to insure a complete removal of insulator (BPSG and silicon oxide), accomplished a result of the high etch rate selectivity of silicon oxide to silicon nitride. Selective removal of silicon nitride via an anisotropic RIE procedure is followed by selective removal of the SiOxNH component, with the dry etch procedure slowing at the appearance of the silicon rich oxide component of the tri-layer composite. Removal of the silicon rich oxide layer via a continuation of the anisotropic RIE procedure is selectively accomplished exposing a portion of the top surface of an conductive or insulator region of a semiconductor device.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
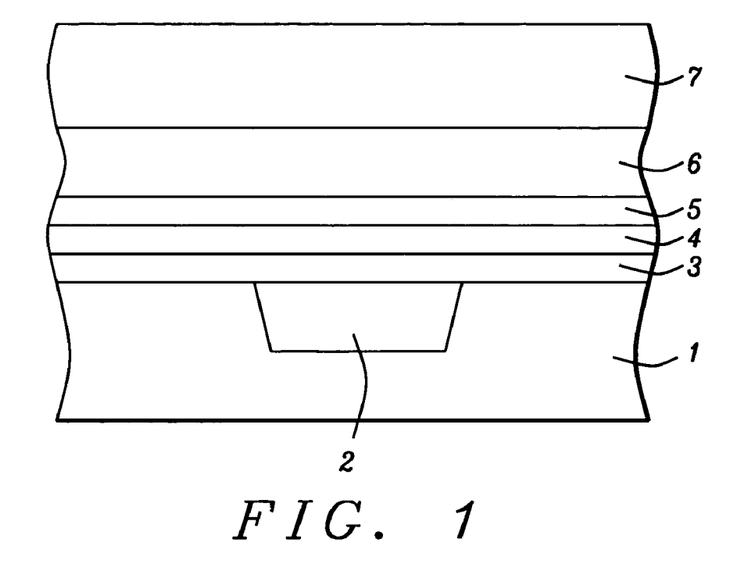
FIGS. 1–6, which schematically in cross-sectional style show key stages of a procedure used to define a contact or via opening in a stack of insulator layers, featuring an underlying tri-layer insulator composite used as a stop layer to allow an over etch cycle to be employed.
Figure 7:
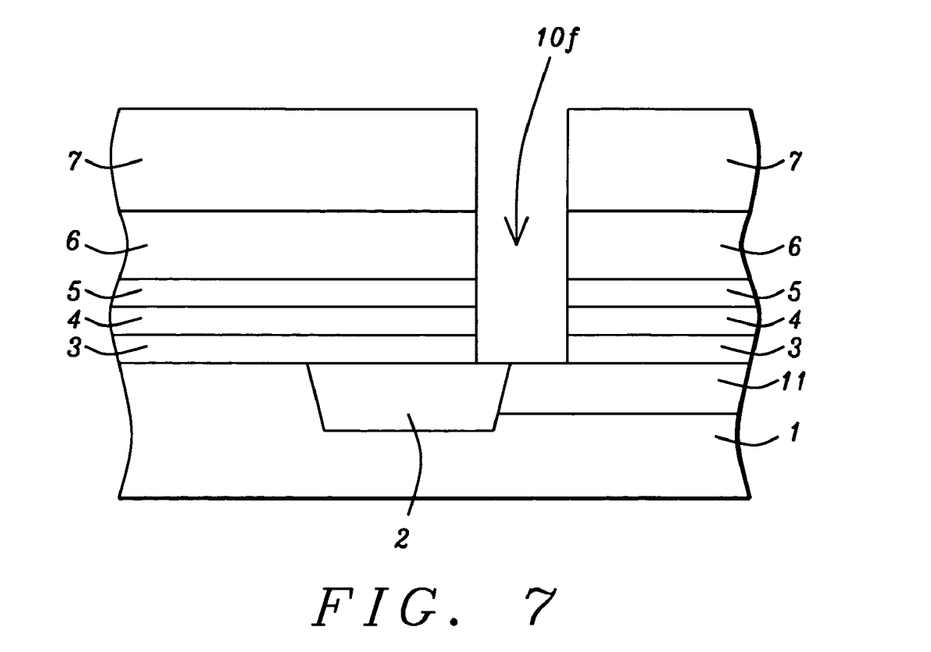
FIGS. 7–8, which in cross-sectional style show a contact hole opening and via hole opening exposing underlying conductive regions of a semiconductor device, wherein the openings are defined in a stack of insulator layers featuring the underlying tri-layer composite.
Figure 8:
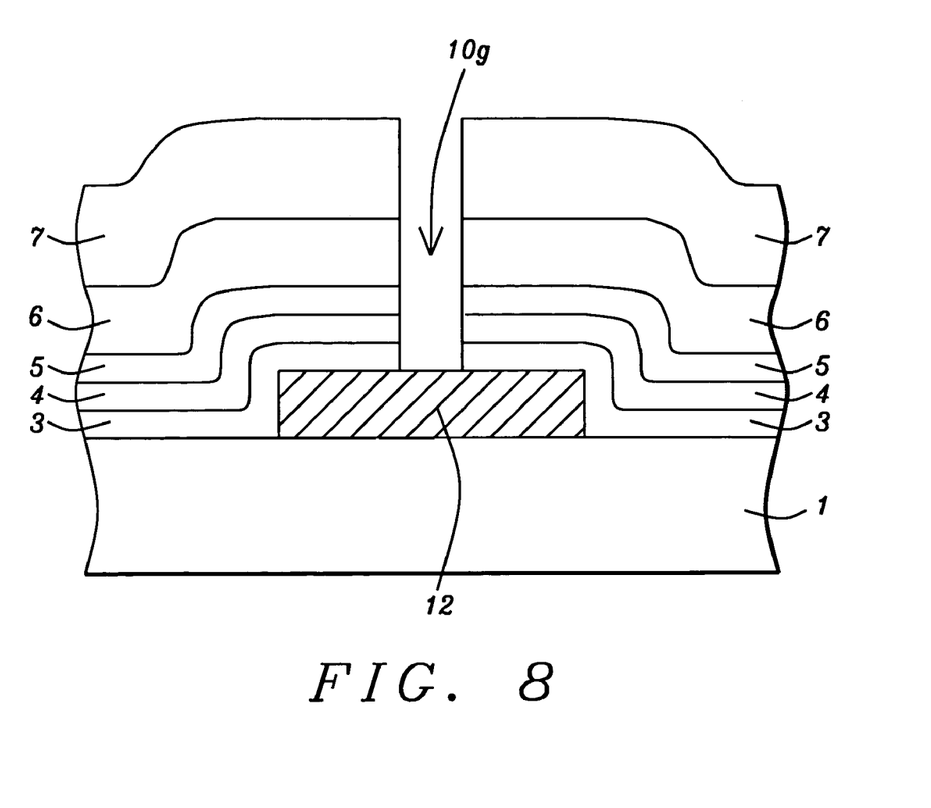

The method of defining a contact or via opening in a stack of insulator layers featuring an underlying tri-layer insulator composite used as an etch stop layer, will now be described in detail. For description purposes FIGS. 1–6, will show key stages used to define of an opening in a stack of insulator layers employing the novel underlying tri-layer etch stop component wherein the opening is shown exposing a top portion of a isolation region. However the same openings, contact or via openings, are shown in FIG. 7–8, exposing conductive regions of a semiconductor device. Semiconductor 1, comprised of single crystalline silicon, featuring a <100> crystallographic orientation, is used and schematically shown in FIG. 1. Isolation region 2, an element such as an insulator filled, shallow trench Isolation (STI) region Is formed In a top portion of semiconductor substrate 1. The STI region can be comprised of silicon oxide. If desired isolation region 2, can be a thermally grown, silicon dioxide field oxide (FOX) region. Formation of the tri-layer insulator composite, to be used as an etch stop during definition of a subsequent contact or via opening, is addressed. First silicon rich-silicon oxide layer 3, is formed to a thickness between about 100 to 200 Angstroms via plasma enhanced chemical vapor deposition (PECVD), via low pressure chemical vapor deposition (LPCVD), or via high density plasma chemical vapor deposition (HDPCVD) procedures. The deposition is performed using a ratio of silane or disilane, to oxygen or nitrous oxide, that results in a refractive index for silicon rich-silicon oxide layer 3, between about 1.485 to 1.55. The silicon rich feature of silicon oxide layer 3, will allow a desired etch rate selectivity to be realized during the definition of the contact or via opening. A liner layer comprised of (SiOxNH) layer 4, is next formed via PECVD, LPCVD, or HDPCVD procedures, at a thickness between about 200 to 500 Angstroms. Finally silicon nitride layer 5, to be used as the etch stop component of the tri-layer insulator composite during the definition and over etch cycles of overlying insulator layers, is deposited to a thickness between about 100 to 200 Angstroms via PECVD, LPCVD, or HDPCVD procedures. The result of formation of the tri-layer insulator composite, comprised of overlying silicon nitride layer 5, (SiOxNH) layer 4, and underlying silicon rich, silicon oxide layer 3, are shown schematically in FIG. 1. The thicker overlying dielectric layers used for the bulk of insulation between conductive interconnect levels or between a conductive level and a conductive region in the semiconductor substrate, are next formed. Boro-phospho-silicate glass (BPSG) layer 6, is obtained at a thickness between about 1500 to 2500 Angstroms, via PECVD or LPCVD procedures. This is followed by formation of overlying silicon oxide layer 7, obtained at a thickness between about 5000 to 6000 Angstroms, again via PECVD or LPCVD procedures, using tetraethylorthsilicate (TEOS) as a source. This is also schematically shown in FIG. 1.

Figure 2:
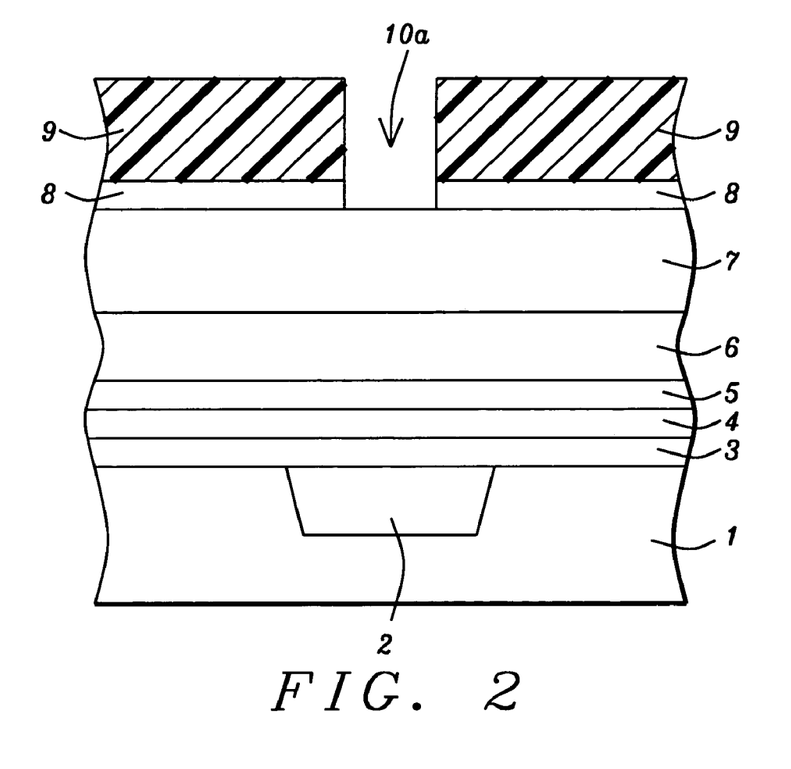

To reduce unwanted scatter during exposure of the photoresist layer to be used for the photoresist masking shape, bottom anti-reflective coating (BARC) layer 8, is applied at a thickness between about 500 to 700 Angstroms. BARC layer 8, can be comprised of organic or inorganic material. A photoresist layer is next applied, exposed and developed, resulting in formation of photoresist masking shape 9, featuring opening 10a, comprised with a diameter between about 0.12 to 0.25 um. Opening 10a, exposes the top surface of the portion of insulator stack to be removed during the definition of the contact or via opening. The development cycle used to form opening 10a, in the photoresist layer may also extend through BARC layer 8. This is schematically shown in FIG. 2.

Figure 3:
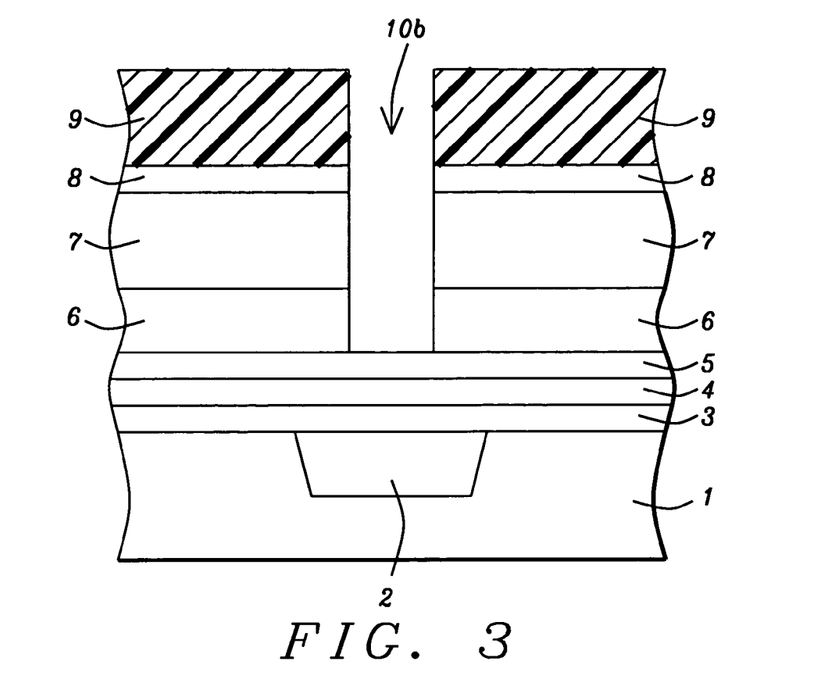
Figure 4:
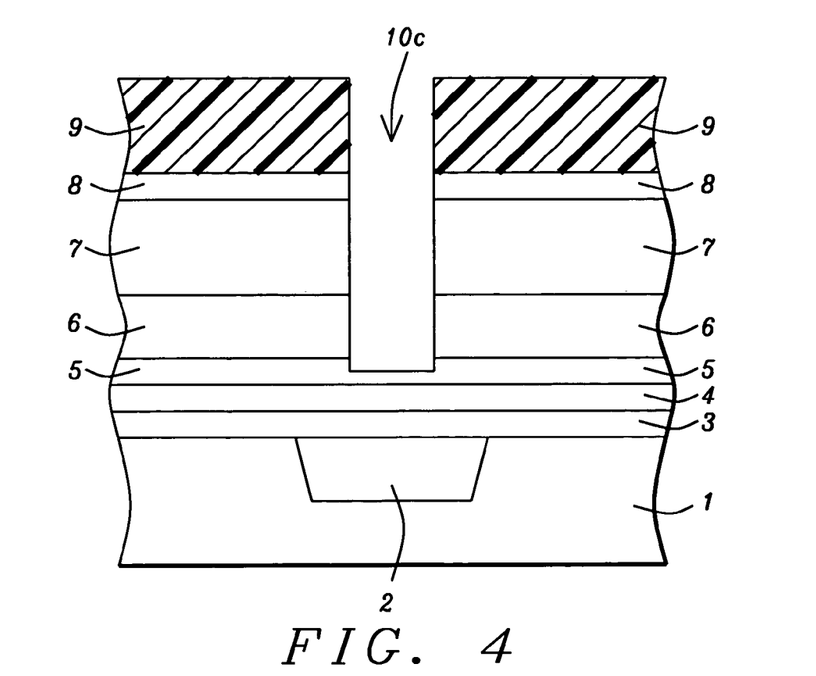

Using photoresist shape 9, as an etch mask an anisotropic RIE procedure performed using $CHF_3$ as an etchant, is employed to define opening 10b, in silicon oxide layer 7, and in BPSG layer 6. The high etch rate ratio of silicon oxide or BPSG to silicon nitride, between about 5 to 1, to 10 to 1, allows this definition cycle to slow or terminate at the appearance of the top surface of silicon nitride layer 5. This is schematically shown in FIG. 3.

The procedures used deposit silicon oxide layer 7, and BPSG layer 6, can result in unwanted thickness uniformity across the semiconductor substrate. Therefore to account for possible thickness distributions of insulator layer, an over etch cycle is employed as a critical component of the contact or via opening definition procedure. The presence of silicon nitride layer 5, with a lower etch rate than silicon oxide or BPSG in $CHF_3$ allows an over etch cycle to be included as a component of the anisotropic RIE procedure. The over etch cycle is performed for a time between about 30 to 60 sec., allowing excess silicon oxide or BPSG to be possibly removed, while only between about 50 to 150 Angstroms of silicon nitride layer 5, is removed. Opening 10c, experiencing the over etch cycle, is now schematically shown in FIG. 4.

Figure 5:
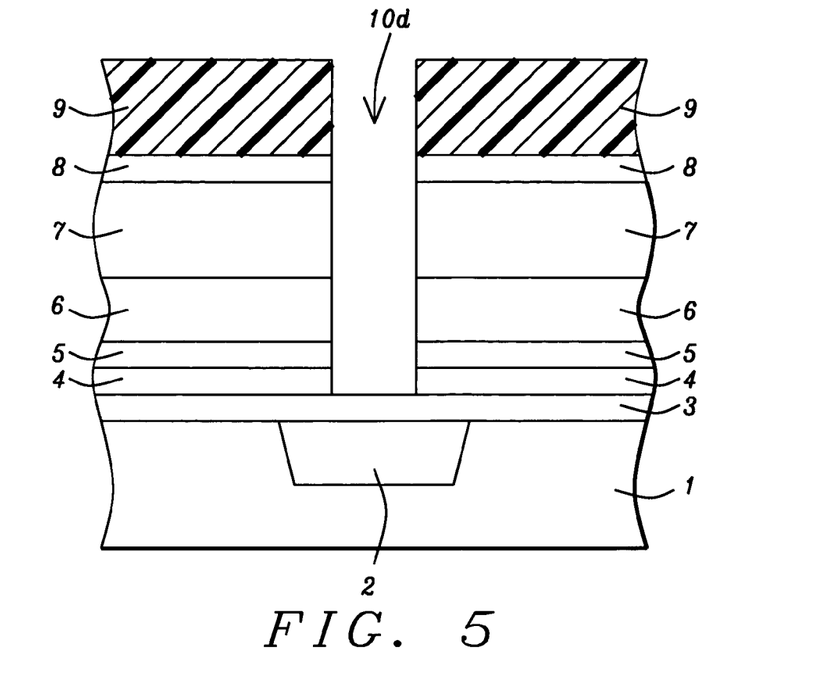
Figure 6:
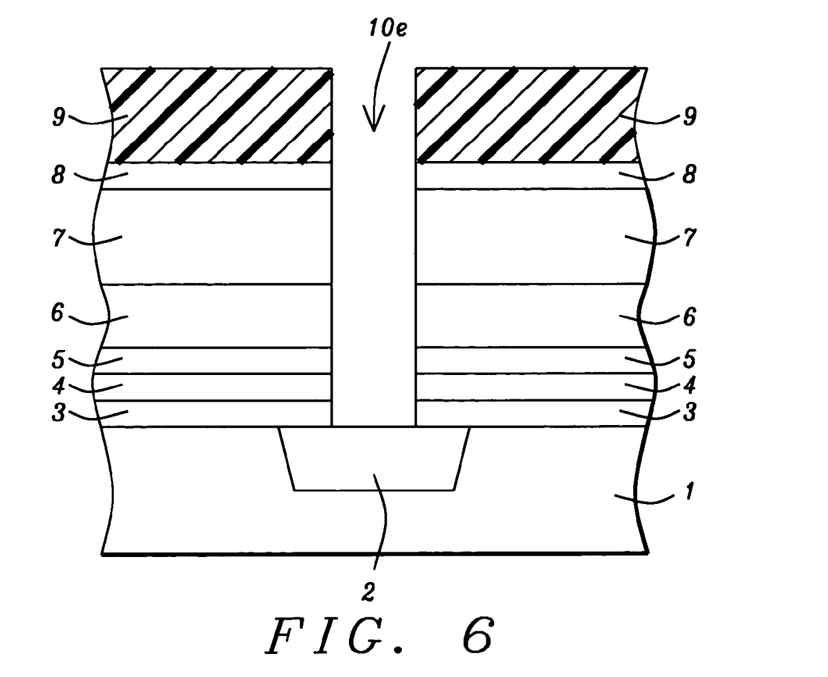

Selective removal of the tri-layer insulator composite is next addressed and schematically described using FIGS. 5–6. The anisotropic RIE procedure used to define the desired opening In silicon oxide layer 7, and in BPSG layer 6, and used to supply the desired over etch cycle, is now continued using $CF_4$ or $Cl_2$, as a selective etchant for silicon nitride layer 5, and for (SiOxNH) layer 4, resulting in opening 10d, schematically shown in FIG. 5. The higher etch rate of silicon nitride and SiOxNH layer 4, in $CF_4$, when compared to silicon rich, silicon oxide layer 3, allows this cycle to terminate in silicon rich-silicon oxide layer 3. The anisotropic RIE procedure is now continued, again using $CHF_3$ as an enchant, allowing exposed portions of silicon rich-silicon oxide layer 3, to be removed resulting in opening 10e, exposing a portion of the top surface of STI region 2. The use of the tri-layer insulator composite, featuring stop layer properties, allowed the needed over etch cycle to be employed without risk of etching or penetrating into the underlying material, STI region 2, in this case. Photoresist shape 9, as well as BARC layer 8, are now removed via plasma oxygen ashing procedures. This is schematically shown in FIG. 6, The process illustrated In FIGS. 1–6, featured a generic description of a procedure used to define a contact or via opening in a stack of insulator layers comprised with an underlying tri-layer insulator composite used as a stop layer for the dry etch definition procedure. FIG. 7, schematically shows an example of this invention in which borderless contact opening 10f, is formed with the above dry etch definition procedure. The stop layer properties of the tri-layer insulator composite allowed the selective anisotropic RIE procedure to expose a portion of a top surface of conductive region 11, without gouging or penetration at the surface of the conductive region. Conductive region 11, can be a source/drain region, or a metal suicide layer formed on an underlying area such as a source/drain region. Another example of the use of the tri-layer insulator composite as a component of an insulator stack is shown schematically in FIG. 8, wherein via opening 10g, is defined using an anisotropic RIE procedure. The presence of the tri-layer insulator composite, comprised of silicon nitride layer 5, (SiOxNH) layer 4, and silicon rich-silicon oxide layer 3, allowed the dry etch procedure to successfully define via opening 10g, while terminating at the appearance of a portion of a top surface of conductive region 12, wherein conductive region 12, can be a metal interconnect structure.

While this invention has been particularly shown and described with reference to the preferred embodiments thereof, it will be understood by those skilled in the art that various changes in form and details may be made without departing from the spirit and scope of this invention.

What is claimed is:

1. A method of defining an opening in a stack of insulator layers on a semiconductor substrate, comprising the steps of:
   providing a conductive region on said semiconductor substrate;
   forming a tri-layer insulator composite on said conductive region and on portions of said semiconductor substrate;
   forming an insulator layer on said tri-layer insulator composite;
   forming an opening in said insulator layer to expose a portion of a top surface of said tri-layer insulator composite; and
   removing portion of said tri-layer insulator composite exposed in said opening, exposing a portion of a top surface of said conductive region,
   wherein said tri-layer insulator composite is comprised of an underlying silicon rich-silicon oxide layer, a hydro-silicon oxynitride (SiOxNH) layer, and an overlying silicon nitride layer.

2. The method of claim 1, wherein said conductive region is a source/drain region in a semiconductor substrate, a metal interconnect structure or a further metal structure.

3. The method of claim 1, wherein said underlying silicon rich-silicon oxide layer of said tri-layer insulator composite, is formed via low pressure chemical vapor deposition (LPCVD), via plasma enhanced chemical vapor deposition (PECVD), or via high density plasma chemical vapor deposition (HDPCVD) procedures, to a thickness between about 100 to 200 Angstroms, using silane or disilane, and oxygen or nitrous oxide as reactants.

4. The method of claim 1, wherein said underlying silicon rich-silicon oxide layer of said tri-layer insulator composite includes a refractive index between about 1.485 to 1.65.

5. The method of claim 1, wherein said hydro-silicon oxynitride (SiOxNH) layer is formed via LPCVD, PECVD, or HDPCVD procedures to a thickness between about 200 to 500 Angstroms.

6. The method of claim 1, wherein said overlying silicon nitride layer is formed via LPCVD or PECVD procedures to a thickness between about 100 to 200 Angstroms.

7. The method of claim 1, wherein said insulator layer is comprised of an underlying boro-phosphosilicate glass (BPSG) layer, obtained via PECVD or LPCVD procedures to a thickness between about 1500 to 2500 Angstroms.

8. The method of claim 1, wherein said insulator layer is comprised of an overlying silicon oxide layer, obtained via PECVD or LPCVD procedures to a thickness between about 5000 to 6000 Angstroms, using tetraethylosilicate (TEOS) as a source.

9. The method of claim 1, wherein said opening in said insulator layer is formed via a dry etch, anisotropic reactive ion etch (RIE) procedure, using $CHF_3$ as an etchant for said insulator layer.

10. The method of claim 1, wherein an over etch cycle used as a component of a dry etch procedure for said opening in said insulator layer, is performed via an anisotropic RIE procedure for a time between about 30 to 60 sec, using $CHF_3$ as an etchant.

11. The method of claim 1, wherein said overlying silicon nitride layer is removed via an anisotropic RIE procedure using $CF_4$ or $Cl_2$ as an etchant.

12. The method of claim 1, wherein said silicon rich-silicon oxide layer of said tri-layer insulator composite is removed via anisotropic RIE procedure using $CHF_3$ as an etchant.

13. A method of forming a opening in a stack of insulator layers located on an underlying conductive region, featuring a tri-layer insulator composite as an underlying component of the stack of insulator layers, used as a stop layer during an over etch cycle used to completely remove overlying components of said stack of insulator layers, comprising the steps of:
   providing said conductive region;
   forming said tri-layer insulator composite comprised of an underlying silicon rich-silicon oxide layer, a hydro-silicon oxynitride (SiOxNH) layer, and an overlying silicon nitride layer:
   forming an overlying insulator layer;
   forming photoresist shape with an opening exposing a portion of a top surface of said overlying insulator layer;
   performing a first phase of a dry etch procedure to remove portions of said overlying insulator layer exposed in said opening in said photoresist shape;
   performing an over etch cycle as a second phase of said dry etch procedure to insure complete removal of said overlying insulator layer, with said over etch cycle terminating at the top surface of said silicon nitride layer of said tri-layer insulator composite;
   performing a third phase of said dry etch procedure to selectively remove exposed portions of said silicon nitride and of said SiOxNH; and
   performing a fourth phase of said anisotropic dry etch procedure to selectively remove exposed portion of said silicon rich-silicon oxide layer, exposing a portion of a top surface of said conductive region.

14. The method of claim 13, wherein said conductive region is a source/drain region in a semiconductor substrate, or a metal structure such as a metal interconnect structure.

15. The method of claim 13, wherein said underlying silicon rich-silicon oxide layer is formed via low pressure chemical vapor deposition (LPCVD), or via plasma enhanced chemical vapor deposition (PECVD) procedures, to a thickness between about 100 to 200 Angstroms, using silane or disilane, and oxygen or nitrous oxide as reactants.

16. The method of claim 13, wherein said SiOxNH layer is formed via LPCVD or via PECVD procedures, to a thickness between about 200 to 500 Angstroms.

17. The method of claim 13, wherein said silicon nitride layer is formed via LPCVD or PECVD procedures, to a thickness between about 100 to 200 Angstroms.

18. The method of claim 13, wherein said overlying insulator layer is comprised of an underlying boro-phosphosilicate glass (BPSG) layer, obtained via PECVD or LPCVD procedures to a thickness between about 1500 to 2500 Angstroms, and comprised of an overlying silicon oxide layer, obtained via PECVD or LPCVD procedures to a thickness between about 5000 to 6000 Angstroms, using tetraethylorthsilicate (TEOS) as a source.

19. The method of claim 13, wherein said first phase of said dry etch procedure, employed to define said opening in said overlying insulator layer, is an anisotropic reactive ion etch (RIE) procedure performed using $CHF_3$ as an etchant for said overlying insulator layer.

20. The method of claim 13, wherein said over etch cycle of said second phase of said dry etch procedure, is an anisotropic RIE procedure performed for a time between about 30 to 60 sec., using $CHF_3$ as an etchant.

21. The method of claim 13, wherein said third phase of said dry etch procedure used to selectively remove said silicon nitride layer, is an anisotropic RIE procedure performed using $CF_4$ or $Cl_2$ as an etchant.

22. The method of claim 13, wherein said fourth phase of said dry etch procedure used to selectively remove said silicon rich-silicon oxide layer, is an anisotropic RIE procedure performed using $CHF_3$ as an etchant.

23. A method of forming an opening in insulator layers, comprising the steps of:
providing a semiconductor substrate;
forming a conductive region directly on and contacting said semiconductor substrate;
forming a tri-layer insulator over said conductive region and on said semiconductor substrate, with said tri-layer insulator comprised of a hydro-silicon oxynitride (SiOxNH) middle layer, an underlying silicon rich-silicon oxide layer, and an overlying silicon nitride layer;
forming an insulator layer directly on and contacting said tri-layer insulator; and
forming an opening in said insulator layer and in said tri-layer insulator to expose said conductive region.

24. The method of claim 23, wherein said conductive region is a source/drain region in a semiconductor substrate, or a metal structure such as a metal interconnect structure.

25. The method of claim 23, wherein said underlying silicon rich-silicon oxide layer includes a thickness between about 100 to 200 Angstroms, said SiOxNH middle layer includes a thickness between about 200 to 500 Angstroms, and said overlying silicon nitride layer includes a thickness between about 100 to 200 Angstroms.

26. The method of claim 23, wherein said overlying insulator layer is comprised of an underlying boro-phospho-silicate glass (BPSG) layer at a thickness between about 1500 to 2500 Angstroms, and comprised of an overlying silicon oxide layer at a thickness between about 5000 to 6000 Angstroms.

27. The method of claim 23, wherein said opening in said insulator layer and in said tri-layer insulator is formed via a dry etch, anisotropic reactive ion etch (RIE) procedure.

* * * * *

UNITED STATES PATENT AND TRADEMARK OFFICE
CERTIFICATE OF CORRECTION

PATENT NO. : 7,074,701 B2 Page 1 of 1
APPLICATION NO. : 10/718881
DATED : July 11, 2006
INVENTOR(S) : Yi-Lung Cheng et al.

It is certified that error appears in the above-identified patent and that said Letters Patent is hereby corrected as shown below:

Column 5, line 39, replace "1.65" with --1.55--.
Column 5, line 54, replace "tetraethylosilicate" with --telraethylorthosilicate--.
Column 6, line 58, replace --totraethylorthsilicate-- with --tetraethylorthosilicate--.

Signed and Sealed this

Fifth Day of December, 2006

JON W. DUDAS
*Director of the United States Patent and Trademark Office*

UNITED STATES PATENT AND TRADEMARK OFFICE
CERTIFICATE OF CORRECTION

PATENT NO. : 7,074,701 B2
APPLICATION NO. : 10/718881
DATED : July 11, 2006
INVENTOR(S) : Yi-Lung Cheng et al.

Page 1 of 1

It is certified that error appears in the above-identified patent and that said Letters Patent is hereby corrected as shown below:

Column 5, line 39, replace "1.65" with --1.55--.
Column 5, line 54, replace "tetraethylosilicate" with --tetraethylorthosilicate--.
Column 6, line 58, replace --tetraethylorthsilicate-- with --tetraethylorthosilicate--.

This certificate supersedes Certificate of Correction issued December 5, 2006.

Signed and Sealed this

Sixteenth Day of October, 2007

JON W. DUDAS
*Director of the United States Patent and Trademark Office*